United States Patent
Belot

(10) Patent No.: US 6,639,468 B2
(45) Date of Patent: *Oct. 28, 2003

(54) LOW-NOISE AMPLIFIER, IN PARTICULAR FOR A CELLULAR MOBILE TELEPHONE

(75) Inventor: Didier Belot, Rives (FR)

(73) Assignee: STMicroelectronics SA, Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/886,852

(22) Filed: Jun. 21, 2001

(65) Prior Publication Data
US 2002/0027475 A1 Mar. 7, 2002

(30) Foreign Application Priority Data

Jul. 12, 2000 (FR) .............................................. 00 09126

(51) Int. Cl.[7] .................................................. H03F 3/45

(52) U.S. Cl. ......................... 330/252; 330/254; 330/302

(58) Field of Search ................................ 330/252, 254, 330/302, 305, 310, 311

(56) References Cited

U.S. PATENT DOCUMENTS

| | | | | |
|---|---|---|---|---|
| 3,768,020 A | | 10/1973 | Kurata | 325/347 |
| 4,520,324 A | * | 5/1985 | Jett, Jr. et al. | 330/285 |
| 5,521,554 A | * | 5/1996 | Okazaki | 330/306 |
| 6,023,192 A | | 2/2000 | Didier | 330/254 |
| 6,310,517 B1 | * | 10/2001 | Nakahara et al. | 330/302 |
| 6,366,166 B1 | * | 4/2002 | Belot | 330/252 |

* cited by examiner

*Primary Examiner*—Tuan T. Lam
(74) *Attorney, Agent, or Firm*—Lisa K. Jorgenson; Allen, Dyey, Doppelt, Milbrath & Gilchrist, P.A.

(57) ABSTRACT

The amplifier includes an input amplifier stage, an output amplifier stage cascode-connected with the input amplifier stage, and a load stage connected to the output stage. The load stage includes a plurality of circuits each including a capacitive component and an inductive component having a Q greater than 10, and having respective different resonant frequencies. All the gain curves respectively associated with all the circuits have, to within a stated tolerance, the same maximum gain value at the resonant frequencies. The gain curves respectively associated with two circuits having respective immediately adjacent resonant frequencies overlap below a threshold 3 dB, to within a stated tolerance, below the maximum gain value.

45 Claims, 4 Drawing Sheets

LOW-NOISE AMPLIFIER, IN PARTICULAR FOR A CELLULAR MOBILE TELEPHONE

FIELD OF THE INVENTION

The present invention relates to electronics, and in particular, to a low-noise amplifier (LNA) used in radio-frequency signal tuners intended for mobile telephone circuits that operate in separate frequency bands. For example, the receive bands of the GSM standard are in the range of 925 to 960 MHz and the receive band of the DCS standard is in the range of 1,805 to 1,880 MHz. The center frequency associated with the receive band in the UMTS standard is 2,200 MHz and for the Bluetooth standard is 2,400 MHz.

BACKGROUND OF THE INVENTION

The amplifiers of mobile telephones operating in accordance with a predetermined reception standard include two cascode-connected amplifier stages and an LC (inductor/capacitor) circuit which has a maximum impedance at a given frequency, in this instance the center frequency of the receive band. The inductance of the circuit has a high Q which produces a relatively narrow gain/frequency curve and a noise figure yielding a very low ratio between output noise and input noise in the receive band.

There is a need to design cellular mobile telephones that operate in accordance with more than one transmission standard, for example multistandard telephones which can operate in accordance with all standards including the DCS standard and the Bluetooth standard. It is therefore necessary to modify the low-noise amplifier stage connected to the receive antenna of the telephone.

A first approach is to use a number of LNAs associated with respective different receive frequency bands (corresponding to the various standards) that the mobile telephone is to be able to receive. The various amplifiers are associated with control means which switch the signal from the antenna to one of the amplifiers according to the receive band selected by the telephone. This approach obviously has a major drawback in terms of overall size and complexity of implementation.

Another approach includes using a degenerated inductive load, i.e., an inductive component having a lower Q. This widens the gain/frequency curve, and signals in separate receive frequency bands can therefore be amplified. However, the gain of this amplifier structure is reduced, and, more seriously, the noise figure is degraded, i.e., the ratio between output noise and input noise is higher. This degraded noise figure is incompatible with some transmission standards, in particular the UMTS standard.

SUMMARY OF THE INVENTION

In view of the foregoing background, an object of the present invention is to provide a wide-band, low-noise amplifier (LNA) that operates in accordance with more than one transmission standard, and has a high gain throughout the range of use of the amplifier, combined with a low ratio between output noise and input noise in the same range of use, i.e., regardless of the frequency band selected within that range.

Another object of the invention is to provide a wide-band, low-noise amplifier that is easy to implement in the form of an integrated circuit and with an overall size that does not represent a penalty.

These and other objects, advantages and features of the present invention are provided by an amplifier that includes an input amplifier stage, an output amplifier stage cascode-connected with the input amplifier stage, and a load stage connected to the output stage.

According to a general feature of the invention the load stage includes a plurality of circuits each including a capacitive component and an inductive component having a Q greater than 10 and having respective different resonant frequencies. The gain curves respectively associated with the circuits have, to within a stated tolerance (for example, approximately ±1 dB), the same maximum gain value at the resonant frequencies. The gain curves respectively associated with two circuits having respective immediately adjacent resonant frequencies overlap below a threshold 3 dB, to within a stated tolerance (for example, approximately ±1 dB), below the maximum gain value.

This produces an amplifier which can operate at all frequencies from the lowest resonant frequency of the load stage to its highest resonant frequency. This type of structure works if the resonant frequencies are very close together to create a "flat" gain over the range of frequencies to be covered. The flat gain and the close spacing of the resonant frequencies are obtained by overlapping the gain curves from a threshold 3 dB below the maximum gain value and by using the same maximum gain value for each LC circuit.

The above structure also yields a flat configuration for the noise figure, leading to a very low value of the output noise/input noise ratio throughout the frequency range to be covered. The number of circuits and their resonant frequencies are obviously chosen so that the various center frequencies correspond to the various standards that a mobile cellular telephone is to be able to accommodate, i.e., from the lowest resonant frequency to the highest resonant frequency.

The amplifier according to the invention is therefore a wide-band amplifier and must not be confused with a "multi-band" amplifier, i.e., an amplifier made up of a number of low-noise amplifiers associated with respective different receive center frequencies. The wide-band amplifier according to the invention is also distinguished from a two-band or even a three-band, or more generally a multi-band amplifier, as described in French Patent Application No. 9,911,032 which describes an LNA equipped with a load stage including a plurality of LC circuits whose resonant frequencies must be very widely spaced.

All the circuits of the load stage of the amplifier according to the invention can be connected either in parallel or in series. If all the circuits are connected in series with the output amplifier stage, all the circuits then have at their respective resonant frequency the same first impedance value to within a specified tolerance (for example, a tolerance of ±20%, which corresponds to the tolerance of ±1 dB referred to above). Furthermore, two circuits associated with two immediately adjacent resonant frequencies have at the median frequency between their respective resonant frequencies the same second impedance value, which is equal to half the first impedance value, again to within the specified tolerance, for example to within ±20%.

In other words, the flatness of the gain curve over the entire frequency range and the overlapping of two adjacent frequency bands is reflected in terms of impedance in what has just been referred to above for an embodiment in which the circuits are all connected in series with the output amplifier stage.

If all the circuits were connected in parallel, the second impedance value (i.e., that corresponding to the median frequency) would then be twice the first impedance value, to within the stated tolerance. However, an embodiment with the circuits connected in series is more advantageous in terms of overall size than an embodiment using a parallel connection. For a series connection, the inductances can have lower values, consequently leading to smaller dimensions on the silicon chip.

Although an amplifier according to the invention can be implemented with a single input, it is particularly advantageous for it to have a differential structure, to enable common mode rejection. Thus in a differential structure embodiment the input amplifier stage and the output amplifier stage each include a pair of transistors. The load stage then includes two identical groups of circuits and each of the two groups is connected to a respective transistor of the output amplifier stage.

The invention also provides an RF signal receiver, and in particular, a cellular mobile telephone including an amplifier as described above.

BRIEF DESCRIPTION OF THE DRAWINGS

Other advantages and features of the invention will become apparent on examining the following detailed description of non-limiting embodiments of the invention and the accompanying drawings, in which.

DETAILED DESCRIPTION OF THE PREFERRED EMBODIMENTS

Figure 1:
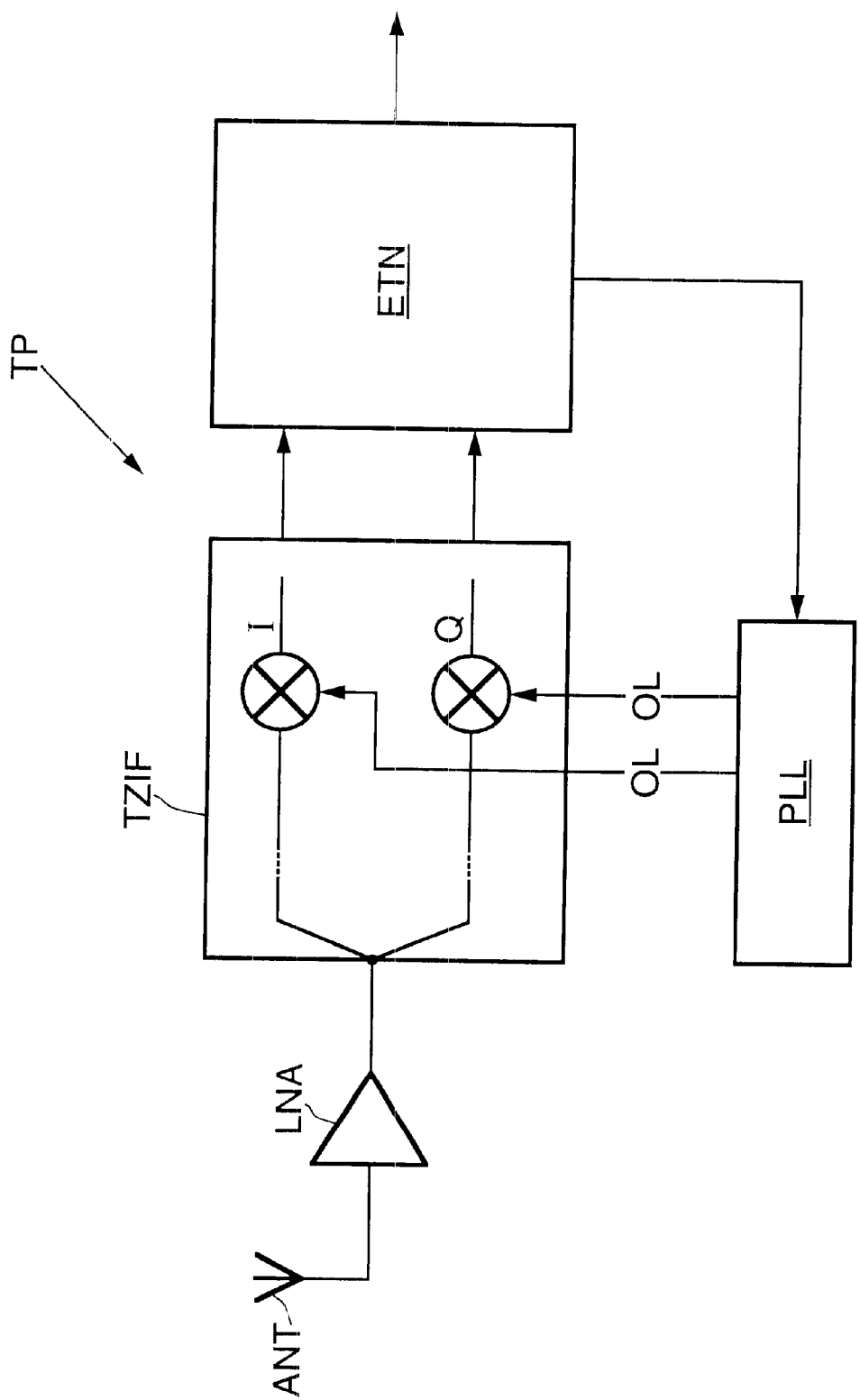
FIG. 1 is a diagram showing a tuner incorporating a low-noise amplifier within a cellular mobile telephone according to the present invention.

In FIG. 1 a cellular mobile telephone TP includes an RF tuner head, or simply tuner, that is able to receive an RF signal from a receive antenna ANT. The receive antenna may be connected to an antenna coupler and/or an isolating transformer (not shown).

The RF signal is fed to a low-noise amplifier (LNA). The output of the LNA is connected to a synthesizer or tuner TZIF, the design of which is well known by one skilled in the art. The tuner TZIF has two processing channels including band-pass filters, variable gain amplifiers and two mixers respectively receiving from a phase-locked loop two local oscillator signals OL with a mutual phase difference of 90° which defines a reference (in phase) channel I and a quadrature channel Q.

The frequency of the local oscillator signals OL defines the nominal frequency of the receive frequency band selected by the mobile telephone. The tuner TZIF is coupled via an analog-to-digital converter stage to a digital processor stage that is formed partly by hardwired logic and partly by a signal processor.

The structure and functions of the stage ETN are also well known to one skilled in the art. To be more precise, in functional terms, the processor stage includes, in addition to means for estimating the impulse response of the transmission channel, means for suppressing intersymbol interference (equalizer), a channel decoder, modulator/demodulator means able to demodulate the signals received and to modulate the signals to be transmitted via a transmit subsystem (not shown in FIG. 1 to simplify the figure).

Standard practice in mobile telephones after demodulating a pilot signal is to have the automatic frequency control means supply a control word to the phase-locked loop PLL to control the accuracy of the local oscillator signals OL. For example, the automatic frequency control means includes a temperature-stabilized voltage-controlled oscillator (VTCXO) providing a reference signal for the PLL.

Figure 2:
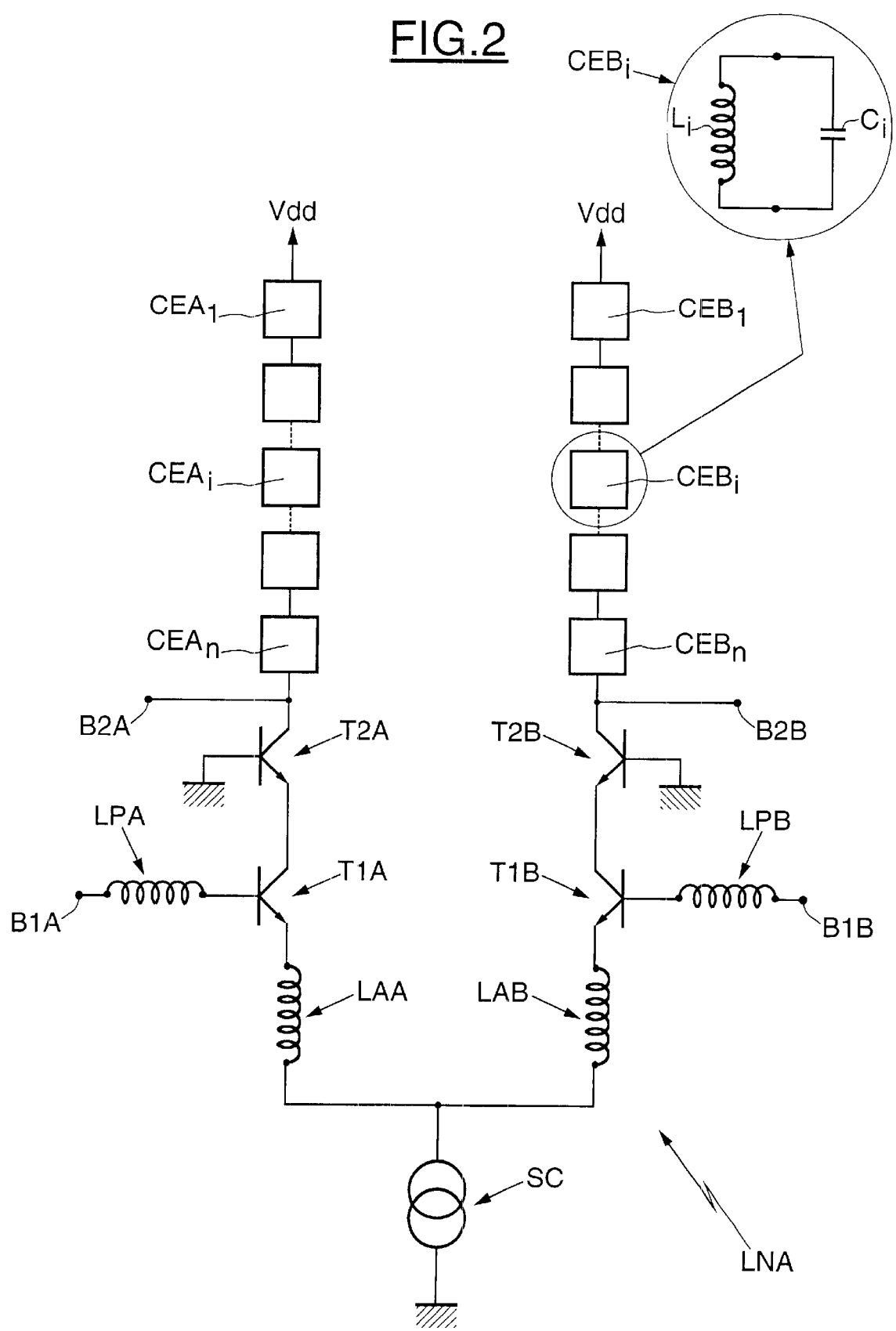
FIG. 2 is a detailed diagram of one embodiment of a differential amplifier according to the present invention.

The LNA is a wide-band amplifier, a differential embodiment of which will now be described with reference to FIG. 2. The LNA, which is implemented in the form of an integrated circuit, for example, essentially includes an input amplifier stage formed by a pair of bipolar transistors T1A, T1B and an output amplifier stage cascode-connected to the input stage and formed by two further bipolar transistors T2A and T2B.

To be more precise, the emitters of the transistors T2A and T2B are respectively connected to the collectors of the respective transistors T1A and T1B. The bases of the transistors T2A and T2B are respectively connected to ground and the collectors of the transistors T2A and T2B form respective differential output terminals B2A and B2B of the amplifier.

The bases of the transistors T1A and T1B are respectively connected to the differential input terminals B1A and B1B of the amplifier via respective inductors LPA and LPB. The emitters of the transistors T1A and T1B are respectively connected to a first terminal of a current source SC via inductors LAA and LAB. The other terminal of the current source SC is connected to ground.

The inductors LPA, LPB, LAA and LAB match the input impedance of the amplifier. To be more precise, the inductors LAA and LAB perform the matching in conjunction with the capacitance of each input of the differential circuit. The input of the differential circuit essentially includes the base-emitter capacitance of each transistor T1A and T1B. The inductors LPA and LPB perform the matching in conjunction with the base capacitance of the respective transistors T1A and T1B. The inductances LPA and LPB symbolize inductances associated with the path of the input signals and the inductances of the connecting terminals and the integrated circuit packaging.

Using a differential structure achieves common mode rejection and the cascode-connected circuits make the input impedance independent of the impedances of the load stage ETCH connected between the collectors of the transistors T2A and T2B and the supply voltage Vdd.

To be more precise, the load stage ETCH is made up of several (at least two) circuits $CEA_i$ and $CEB_i$. All the circuits $CEA_1$–$CEA_n$ are connected in series between the supply voltage Vdd and the collector of the transistor T2A, and all the circuits $CEB_1$–$CEB_n$ are connected in series between the supply voltage Vdd and the collector of the transistor T2B.

All the circuits are structurally identical and in this embodiment, as shown for the circuit $CEB_i$, comprises an LC circuit including an inductive component $L_i$ in parallel with a capacitive component $C_i$. In fact, the impedance of this circuit is not totally reactive, which also includes a real resistive part representing the sum of all the losses of the inductor, rather than the resistance of the metal from which the inductor is made. As explained in more detail below, the spurious resistance is used to set the dimensions of the components of each circuit.

Each circuit has a resonant frequency different from the resonant frequency of the other circuits and amplifies a signal whose frequency is within a frequency band centered on its resonant frequency. The resonant frequency $F_i$ is equal to:

$$F_i = \omega_i/2\pi \quad (1)$$

where $$\omega_i = 1/\sqrt{L_i C_i} \quad (2)$$

Each inductive component $L_i$ has a Q greater than 10, for example a Q equal to 20, and therefore has a sufficiently narrow gain curve and a non-degraded noise figure. The value of the noise figure of an integrated inductive component is defined by the fabrication technology and is equal to $$L_i \omega_i / R_i \quad (3)$$

where $R_i$ is the spurious resistance associated with the inductive component $L_i$.

Figure 3:
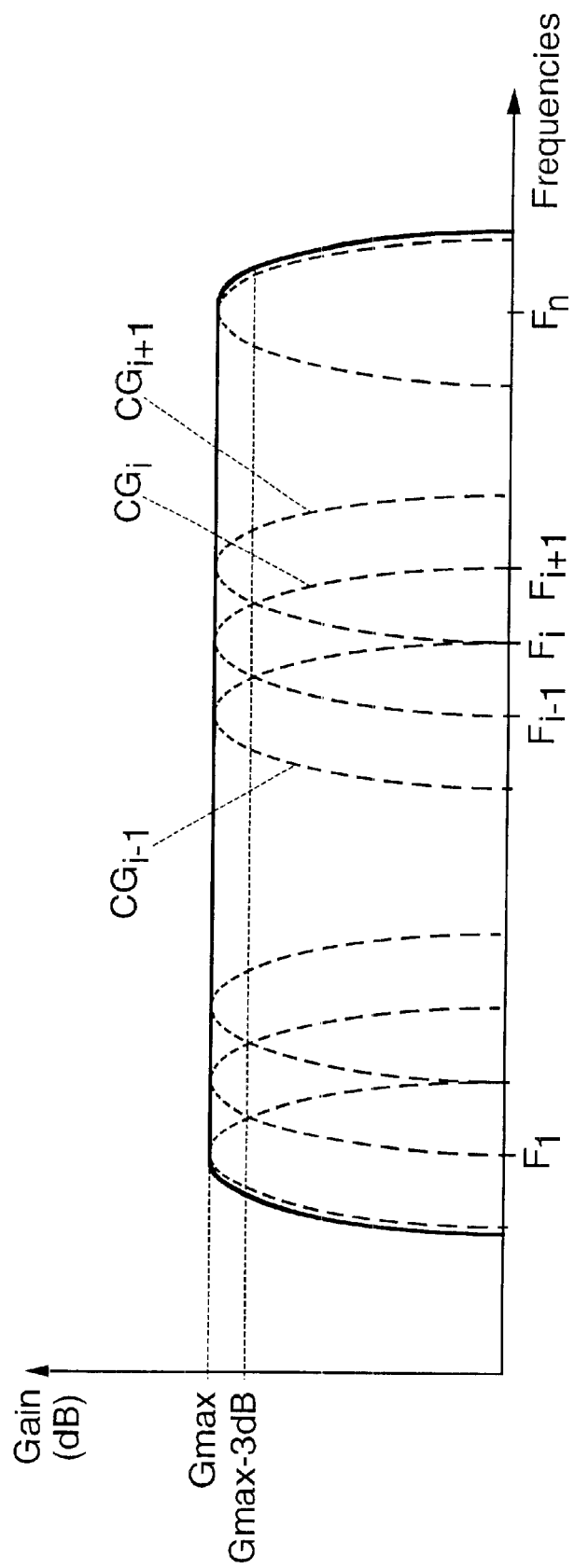
FIG. 3 is a gain/frequency curve obtained with a low-noise amplifier according to the present invention.

The inductance and capacitance values of the circuits are chosen so that, as shown in FIG. 3, the resonant frequencies $F_i$ are sufficiently closely spaced to obtain a substantially flat gain curve in the range of frequencies $F_1-F_n$ in question.

In other words, the gain curve $CG_i$ associated with a circuit having a resonant frequency $F_i$ (i.e., the band of frequencies actually amplified by that circuit) overlaps the gain curve $CG_{i+1}$ (respectively $CG_{i-1}$) associated with the circuit whose resonant frequency $F_{i+1}$ (respectively $F_{i-1}$) is immediately adjacent the frequency $F_i$. The overlap is below a threshold 3 dB (±1 dB) below the maximum gain value Gmax, which is the same for all the gain curves $CG_i$.

Figure 4:
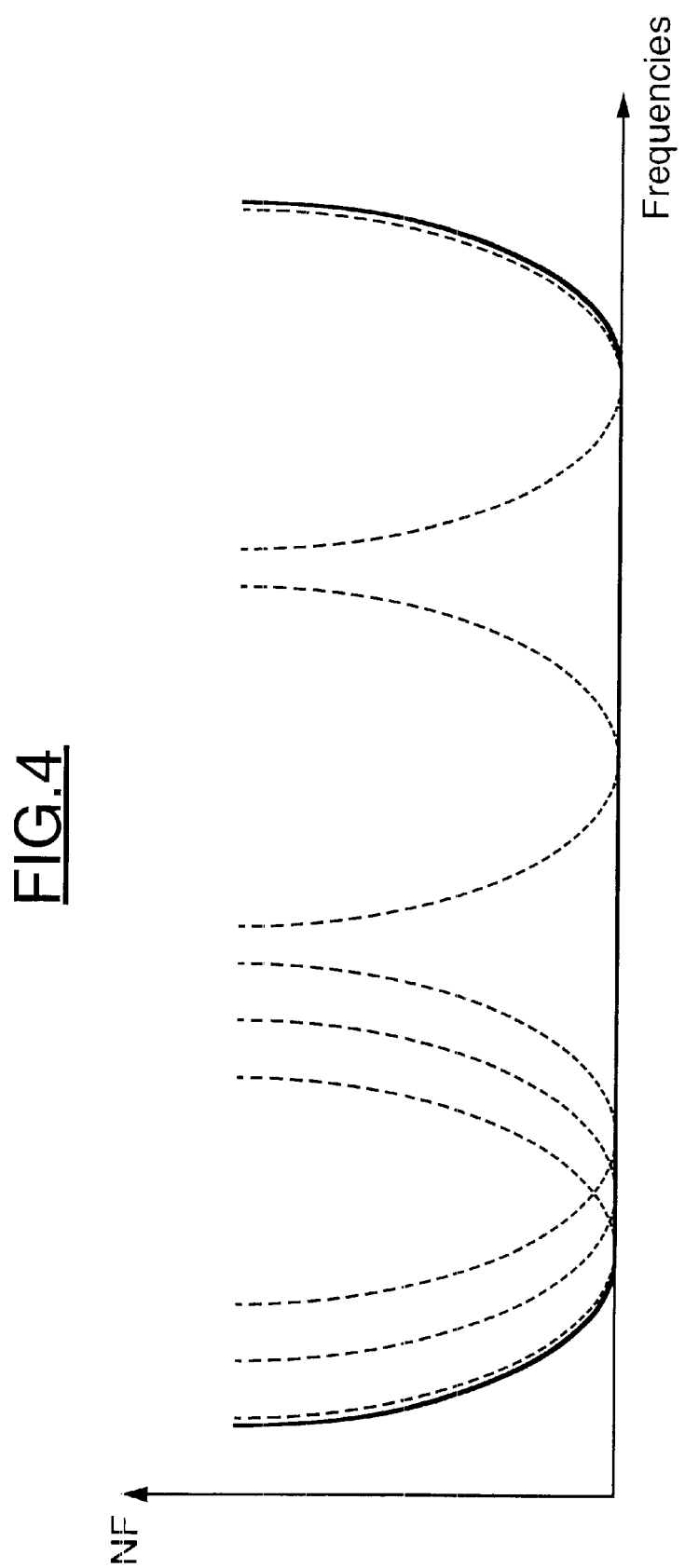
FIG. 4 is a noise figure curve obtained with a low-noise amplifier according to the present invention.

Accordingly, given the Q chosen for each inductive component of a circuit and the close spacing of the resonant frequencies, there is obtained not only the gain curve shown in FIG. 3 but also the noise figure NF shown in FIG. 4. In FIG. 4 the dashed lines show the noise figures respectively associated with each circuit and it can be seen that the global noise figure for white noise at the input yields an extremely low output noise throughout the range of frequencies concerned.

In terms of impedance, the fact that all the gain curves have the same maximum gain value Gmax and that the gain curves overlap below a 3 dB threshold is reflected in the fact that all the circuits have at their respective resonant frequency (or at their respective resonant angular frequency $\omega_i$) a first impedance value (which is a maximum value) to within a stated tolerance (for example ±20%). Moreover, two circuits associated with two immediately adjacent resonant frequencies have at the median frequency (or at the median angular frequency) between their two resonant frequencies the same second impedance value equal to half the first impedance value, for example also to within a tolerance of ±20%.

The above is reflected in equation (4) below:

$$Z_i\left[\frac{\omega_i + \omega_{i+1}}{2}\right] = Z_{i+1}\left[\frac{\omega_i + \omega_{i+1}}{2}\right] = \frac{1}{2}Z_i(\omega_i) = \frac{1}{2}Z_{i+1}(\omega_{i+1}) \quad (4)$$

in which $Z_i$ is the impedance of a circuit $CEA_i$ (or $CEB_i$) and $Z_{i+1}$ is the impedance of the circuit associated with a resonant frequency (or a resonant angular frequency) immediately adjacent that associated with the circuit $CEA_i$ (or $CEB_i$). $Z_i(\omega_i)$ is the impedance value at the angular frequency $\omega_i$.

The inductance values $L_i$ and capacitance values $C_i$ of each circuit are fixed progressively, for example from the lowest resonant frequency $F_1$ corresponding to the lower limit of the global frequency band to be covered.

An example follows for the determination of these values using two circuits associated with two adjacent resonant frequencies, namely the frequencies $F_1$ and $F_2$ corresponding to the angular frequencies $\omega_1$ and $\omega_2$ and associated with the circuits $CEA_1$ (or $CEB_1$) and $CEA_2$ (or $CEB_2$).

The impedance $Z_1$ of the circuit $CEA_1$ at the angular frequency $\omega$ is defined by equation (5) below:

$$Z_1(\omega) = \frac{R_1 + jL_1\omega}{1 - L_1 C_1 \omega^2 + jR_1 C_1 \omega} \quad (5)$$

in which $j^2 = -1$.

The angular frequencies $\omega_1$, $\omega_2$ and the Q values $Q_1$ and $Q_2$ are respectively defined by equations (6), (7), (8) and (9) below:

$$\omega_1 = 1/\sqrt{L_1 C_1} \quad (6)$$

$$\omega_2 = 1/\sqrt{L_2 C_2} \quad (7)$$

$$Q_1 = \frac{L_1 \omega_1}{R_1} \quad (8)$$

$$Q_2 = \frac{L_2 \omega_2}{R_2} \quad (9)$$

From equations (5) and (6) the impedance $Z_1$ at the angular frequency $\omega_1$ is defined by equation (10) below:

$$Z_1(\omega_1) = \frac{L_1}{R_1 C_1} - j\sqrt{L_1/C_1} = A_1 + jB_1 \quad (10)$$

Likewise, the impedance $Z_1$ at the median angular frequency $$\frac{\omega_1 + \omega_2}{2}$$

is defined by equation (11) below:

$$Z_1\left[\frac{\omega_1 + \omega_2}{2}\right] = A + jB \quad (11)$$

in which A is defined by equation (12):

$$A = \frac{R_1}{1 + R_1 C_1\left[\frac{\omega_1 + \omega_2}{2}\right] - L_1 C_1\left[\frac{\omega_1 + \omega_2}{2}\right]^2} \quad (12)$$

and B is defined by equation (13):

$$B = \frac{L_1\left[\frac{\omega_1 + \omega_2}{2}\right]}{1 + R_1 C_1\left[\frac{\omega_1 + \omega_2}{2}\right] - L_1 C_1\left[\frac{\omega_1 + \omega_2}{2}\right]^2} \quad (13)$$

Given equations (4) and (10), A (for example) is also defined by equation (14) below:

$$A = A_1/2 = 1/2\frac{L_1}{R_1 C_1} \quad (14)$$

which, substituting equation (12), yields equation (15) below:

$$-\frac{L_1 C_1}{R_1}\left[\frac{\omega_1 + \omega_2}{2}\right]^2 + C_1\left[\frac{\omega_1 + \omega_2}{2}\right] + \frac{L_1 - 2C_1 R_1^2}{L_1 R_1} = 0$$

Equation (15) is a second order equation in which the unknown x is equal to $(\omega_1+\omega_2)/2$. The value of the resonant frequency $F_1$ is then fixed, for example at 2 GHz, which corresponds to a value $\omega_1=1.25\times10^{10}$ rd/s. The inductance value $L_1$ is also fixed, for example at 2 nH, which, given the technology used (SiGe BiCMOS technology with aluminum conductive components 2.5 microns thick, a 15 Ohm/cm substrate and intermetal oxides formed of $SiO_2$), yields $Q_1=20$.

From equation (8), it can be determined that the resistance value $R_1$ is equal to 1.25 Ohms. It can then be determined from equation (6) that the capacitance value $C_1$ is equal to 3.2 pF. Solving equation (15) gives for the variable x the value $12.7^{10}$, the value of $\omega_2$ is therefore $12.9\times10^9$ rd/s, and the frequency $F_2=2.05$ GHz.

The inductance value $L_2$ is then fixed, for example at 2 nH, which yields $Q_2=20$. A value $R_2=1.25$ Ohms is obtained from equation (9) and a capacitance value $C_2=3.1$ pF is obtained from equation (7). The frequency $F_3$, which is close to the frequency $F_2$, can then be determined by carrying out the same operations previously described substituting $\omega_2$ for $\omega_1$ and $\omega_3$ for $\omega_2$. The above procedure is carried out repetitively until the frequency $F_n$ and consequently the values $L_n$ and $C_n$, have been determined. This produces a circuit spacing of 50 MHz.

Accordingly, for a mobile telephone capable of covering all the standards from the DCS standard to the Bluetooth standard, for example, a dozen circuits $CEA_i$ will be needed (and a dozen circuits $CEB_i$). It would of course have been possible to fix the capacitance value in each of the calculations described above to determine the inductance value. It is nevertheless preferable to fix the inductance value and determine the capacitance value because fixing the inductance value makes it easy to choose a high Q.

In the embodiment described all the inductive components $L_i$ are identical and the circuits $CEA_i$ or $CEB_i$ differ from each other in terms of the value of the capacitive component. In material terms, it is not necessary for two circuits associated with two immediately adjacent resonant frequencies to be disposed side by side on the silicon.

That which is claimed is:

1. An amplifier comprising:
    an input amplifier stage;
    an output amplifier stage connected to said input amplifier stage; and
    a load stage connected to said output amplifier stage and comprising a plurality of circuits, each circuit comprising a capacitive component and an inductive component having a Q greater than 10, and each circuit having a resonant frequency different from a resonant frequency of the other circuits,
    each circuit having a gain versus frequency curve such that all the gain versus frequency curves have, to within a tolerance, a same maximum gain value at a respective resonant frequency, and the respective gain versus frequency curves associated with two circuits having immediately adjacent resonant frequencies overlapping below a threshold at 3 dB, to within the tolerance, below the maximum gain value.

2. An amplifier according to claim 1, wherein the tolerance has an absolute value of about 1 dB.

3. An amplifier according to claim 1, wherein said plurality of circuits are connected in series with said output amplifier stage.

4. An amplifier according to claim 1, wherein each circuit has at their respective resonant frequency a first impedance value that is the same as the first impedance values of the other circuits, to within a second tolerance.

5. An amplifier according to claim 4, wherein two circuits associated with two immediately adjacent resonant frequencies have at a median frequency between their two resonant frequencies a same second impedance value equal to half the first impedance value, to within the second tolerance.

6. An amplifier according to claim 5, wherein the second tolerance is equal to about 20 %.

7. An amplifier according to claim 1, wherein said capacitive component and said inductive component for each circuit are connected in parallel.

8. An amplifier according to claim 7, wherein said inductive components for each circuit are equal.

9. An amplifier according to claim 7, wherein said capacitive components for each circuit are equal.

10. An amplifier according to claim 1, wherein said input amplifier stage comprises a first pair of transistors to define a differential input amplifier stage; and wherein said output amplifier stage comprises a second pair of transistors to define a differential output amplifier stage.

11. An amplifier according to claim 10, wherein said plurality of circuits are separated into two groups, with each group connected to a respective transistor of said output amplifier stage.

12. An amplifier according to claim 11, wherein said circuits in each group are connected in series.

13. An amplifier comprising:
    an input amplifier stage;
    an output amplifier stage connected to said input amplifier stage; and
    a load stage comprising a plurality of circuits connected in series with said output amplifier stage, each circuit comprising a capacitive component and an inductive component, and each circuit having a resonant frequency different from a resonant frequency of the other circuits.

14. An amplifier according to claim 13, wherein each circuit has a Q greater than 10.

15. An amplifier according to claim 13, wherein each circuit has a gain versus frequency curve such that all the gain versus frequency curves have, to within a tolerance, a same maximum gain value at a respective resonant frequency, and the respective gain versus frequency curves associated with two circuits having immediately adjacent resonant frequencies overlapping below a threshold at 3 dB, to within the tolerance, below the maximum gain value.

16. An amplifier according to claim 15, wherein the tolerance has an absolute value of about 1 dB.

17. An amplifier according to claim 13, wherein each circuit has at their respective resonant frequency a first impedance value that is the same as the first impedance values of the other circuits, to within a tolerance.

18. An amplifier according to claim 17, wherein two circuits associated with two immediately adjacent resonant frequencies have at a median frequency between their two resonant frequencies a same second impedance value equal to half the first impedance value, to within the tolerance.

19. An amplifier according to claim 17, wherein the tolerance is equal to about 20%.

20. An amplifier according to claim 13, wherein said capacitive component and said inductive component for each circuit are connected in parallel.

21. An amplifier according to claim 13, wherein said input amplifier stage comprises a first pair of transistors to define a differential input amplifier stage; and wherein said output amplifier stage comprises a second pair of transistors to define a differential output amplifier stage.

22. An amplifier according to claims 21, wherein said plurality of circuits are separated into two groups, with each group connected to a respective transistor of said output amplifier stage.

23. A receiver comprising:
an amplifier comprising
an input amplifier stage,
an output amplifier stage connected to said input amplifier stage, and
a load stage comprising a plurality of circuits connected in series with said output amplifier stage, each circuit comprising a capacitive component and an inductive component, and each circuit having a resonant frequency different from a resonant frequency of the other circuits; and
a tuner connected to said amplifier.

24. A receiver according to claim 23, further comprising a processor connected to said tuner.

25. A receiver according to claim 23, wherein each circuit has a Q greater than 10.

26. A receiver according to claim 23, wherein each circuit has a gain versus frequency curve such that all the gain versus frequency curves have, to within a tolerance, a same maximum gain value at a respective resonant frequency, and the respective gain versus frequency curves associated with two circuits having immediately adjacent resonant frequencies overlapping below a threshold at 3 dB, to within the tolerance, below the maximum gain value.

27. A receiver according to claim 26, wherein the tolerance has an absolute value of about 1 dB.

28. A receiver according to claim 23, wherein each circuit has at their respective resonant frequency a first impedance value that is the same as the first impedance values of the other circuits, to within a tolerance.

29. A receiver according to claim 28, wherein two circuits associated with two immediately adjacent resonant frequencies have at a median frequency between their two resonant frequencies a same second impedance value equal to half the first impedance value, to within the tolerance.

30. A receiver according to claim 28, wherein the tolerance is equal to about 20%.

31. A receiver according to claim 24, wherein the receiver is part of a cellular mobile telephone.

32. A method for making an amplifier comprising:
connecting an output amplifier stage to an input amplifier stage; and
connecting a load stage comprising a plurality of circuits in series with the output amplifier stage, each circuit comprising a capacitive component and an inductive component, and each circuit having a resonant frequency different from a resonant frequency of the other circuits.

33. A method according to claim 32, wherein each circuit has a Q greater than 10.

34. A method according to claim 32, wherein each circuit has a gain versus frequency curve such that all the gain versus frequency curves have, to within a tolerance, a same maximum gain value at a respective resonant frequency, and the respective gain versus frequency curves associated with two circuits having immediately adjacent resonant frequencies overlapping below a threshold at 3 dB, to within the tolerance, below the maximum gain value.

35. A method according to claim 34, wherein the tolerance has an absolute value of about 1 dB.

36. A method according to claim 32, wherein each circuit has at their respective resonant frequency a first impedance value that is the same as the first impedance values of the other circuits, to within a tolerance.

37. A method according to claim 36, wherein two circuits associated with two immediately adjacent resonant frequencies have at a median frequency between their two resonant frequencies a same second impedance value equal to half the first impedance value, to within the tolerance.

38. A method according to claim 36, wherein the tolerance is equal to about 20%.

39. A receiver comprising:
an amplifier comprising
an input amplifier stage,
an output amplifier stage connected to said input amplifier stage, and
a load stage connected to said output amplifier stage and comprising a plurality of circuits, each circuit comprising a capacitive component and an inductive component, and each circuit having a resonant frequency different from a resonant frequency of the other circuits;
each circuit having a gain versus frequency curve such that all the gain versus frequency curves have, to within a tolerance, a same maximum gain value at a respective resonant frequency, and the respective gain versus frequency curves associated with two circuits having immediately adjacent resonant frequencies overlapping below a threshold at 3 dB, to within the tolerance, below the maximum gain value; and
a tuner connected to said amplifier.

40. A receiver according to claim 39, further comprising a processor connected to said tuner.

41. A receiver according to claim 39, wherein each circuit has a Q greater than 10; and wherein the tolerance has an absolute value of about 1 dB.

42. A receiver according to claim 39, wherein said plurality of circuits are connected in series with said output amplifier stage.

43. A method for making an amplifier comprising:
connecting an output amplifier stage to an input amplifier stage; and
connecting a load stage to the output amplifier stage, the load stage comprising a plurality of circuits, each circuit comprising a capacitive component and an inductive component, and each circuit having
a resonant frequency different from a resonant frequency of the other circuits, and
a gain versus frequency curve such that all the gain versus frequency curves have, to within a tolerance, a same maximum gain value at a respective resonant frequency, and the respective gain versus frequency curves associated with two circuits having immediately adjacent resonant frequencies overlapping below a threshold at 3 dB, to within the tolerance, below the maximum gain value.

44. A method according to claim 43, wherein each circuit has a Q greater than 10; and wherein the tolerance has an absolute value of about 1 dB.

45. A method according to claim 43, wherein the plurality of circuits are connected in series with the output amplifier stage.

* * * * *